United States Patent [19]
Sugimoto et al.

[11] Patent Number: 5,209,671
[45] Date of Patent: May 11, 1993

[54] ELECTRIC CONNECTION STRUCTURE BETWEEN CIRCUIT BOARDS

[75] Inventors: Shinichi Sugimoto, Tenri; Hisao Kawaguchi, Nara, both of Japan

[73] Assignee: Sharp Kabushiki Kaisha, Osaka, Japan

[21] Appl. No.: 858,489

[22] Filed: Mar. 27, 1992

[30] Foreign Application Priority Data

Mar. 28, 1991 [JP] Japan .................................. 3-64539

[51] Int. Cl.⁵ .............................................. H01R 9/09
[52] U.S. Cl. ...................................... 439/67; 439/65; 439/73
[58] Field of Search ..................... 439/55, 65, 67, 73, 439/77, 493

[56] References Cited

U.S. PATENT DOCUMENTS

| | | | |
|---|---|---|---|
| 4,289,364 | 9/1981 | Strom et al. | 439/67 |
| 4,806,105 | 2/1989 | Muzslay . | |
| 4,886,461 | 12/1989 | Smith | 439/67 |
| 4,969,835 | 11/1990 | Kobayashi et al. | 439/161 |

FOREIGN PATENT DOCUMENTS 2390070  1/1978  France .
4-44288  2/1992  Japan .

OTHER PUBLICATIONS

IBM Technical disclosure bulletin, vol. 7, No. 3, Aug. 1964.
English Abstract of Japanese Patent 59017536 (Jan. 1984).
English Abstract of Japanese Patent 59017535 (Jan. 1984).
English Abstract of Japanese Patent 60050513 (Mar. 1985).

Primary Examiner—Larry I. Schwartz
Assistant Examiner—Khiem Nguyen

[57] ABSTRACT

An electric connection structure including a first circuit board having a terminal on one side thereof, a second circuit board having a terminal on one side thereof, flexible wiring means having a flexible base and a wiring portion thereon and electrically connecting the terminal of the first circuit board with the terminal of the second circuit board. The first and second circuit boards are in face-to-face contact with each other at terminal-free sides thereof; the flexible wiring means catches the first and second circuit boards so as to come into contact with their terminals at the wiring portion. A holding device removably clamps the first and second circuit boards together with the wiring portion of the flexible wiring means sandwiched by the holding device and the first and second circuit boards so as to press the wiring portion against the terminals of the first and second circuit boards.

20 Claims, 5 Drawing Sheets

ELECTRIC CONNECTION STRUCTURE BETWEEN CIRCUIT BOARDS

FIELD OF THE INVENTION

This disclosure relates to an electric connection structure between circuit boards, and more particularly to an electric connection structure for connecting, for example, an electrode terminal of a liquid crystal panel with a terminal of a control board through a flexible wiring.

RELATED ART

FIG. 9 shows an electric connection structure of a conventional type for use in a liquid crystal display in which a liquid crystal panel 20 comprises a liquid crystal material 15 sealed between a pair of substrates 7 and 12, and a multiplicity of electrode terminals 13 are disposed in an end portion of the substrate 7. When the liquid crystal panel 20 is packaged to form a liquid crystal display, the electrode terminals 13 on the substrate 7 are electrically connected with terminals 16 in an end portion of a control board 5 through a flexible printed circuit 2. The flexible printed circuit 2 comprises on a flexible base a driving LSI 4 and wiring lines 14a and 14b extending from an input and an output of the LSI 4 and terminating with a signal input terminal 11 and a signal output terminal 10, respectively. In this example the signal input terminal 11 is connected with the terminals 16 of the control board 5 by soldering (soldered portion 6). On the other side, the signal output terminal 10 is pressed against the electrode terminals 13 of the substrate 7 by a clip 1 U-shaped in section made of a shape memory alloy or shape memory resin. Note that the reference numeral 3 denotes a buffer member formed from a silicone rubber or copper foil. Thus, a control signal is transmitted from the control board 5 to the liquid crystal panel 20 through the LSI 4 to drive the panel 20. In another device the connection between the signal output terminal 10 and the electrode terminal 13 is made not by pressing but with an anisotropic electric conductive film.

The above conventional connection structure, however, involves a lengthy work for making connection, because two connection steps are needed for connecting the signal output terminal 10 with the electrode terminals 13 of the liquid crystal panel 20 the first being the pressure connection or the anisotropic conductive film and the second being the signal input terminal 11 with the terminal 16 of the control board 5 by soldering. Also, if the liquid crystal panel 20 or the driving LSI 4 is a defective article, or the connection on the panel side is incomplete, the display unit needs to be reworked with a troublesome separating of the soldered portion 6 from the control board 5.

SUMMARY OF THE INVENTION

In view of the foregoing situation, the present invention aims to provide a novel electric connection structure which allows a shortened connecting operation as well as a facilitated reworking operation, when terminals of a first circuit board (for example, a liquid crystal panel) are to be connected with those of a second circuit board (for example, a control board) through a flexible wiring.

Thus, the present invention provides an electric connection structure comprising a first circuit board having a terminal on one side thereof, a second circuit board having a terminal on one side thereof, flexible wiring means having a flexible base and a wiring portion thereon and electrically connecting the terminal of said first circuit board with the terminal of said second circuit board, and holding means.

The first and second circuit boards are in face-to-face contact with each other at terminal-free sides thereof; said flexible wiring means catches said first and second circuit boards so as to come into contact with their terminals at said wiring portion. The holding means removably clamps said first and second circuit boards together with said wiring portion of said flexible wiring means sandwiched by said holding means and said first and second circuit boards so as to press said wiring portion against the terminals of said first and second circuit boards.

According to the present invention, opposite ends (wiring portion) of the flexible wiring means are simultaneously pressed against the terminals of the first and second boards by the holding means, respectively. Stated otherwise, connections at the first and second boards can be made by the holding means with a one-time clamping operation, leading accordingly to a facilitated and shortened connecting step as compared with the prior art. In addition, if only the holding means is removed, the connections are released, and the first and second boards and the flexible wiring means are taken apart. Thus, the device can readily be reworked if there is a defective component.

The holding means may be a clip which is preferably made of a shape memory alloy or shape memory resin, substantially U-shaped and large enough to clamp the first and second circuit boards together. Also, each of the terminals may be disposed at any place of one side of each board.

DETAILED DESCRIPTION OF THE PREFERRED EMBODIMENT

An electric connection structure according to the present invention will be described in greater detail by way of preferred embodiments with reference to the drawings.

Figure 1:
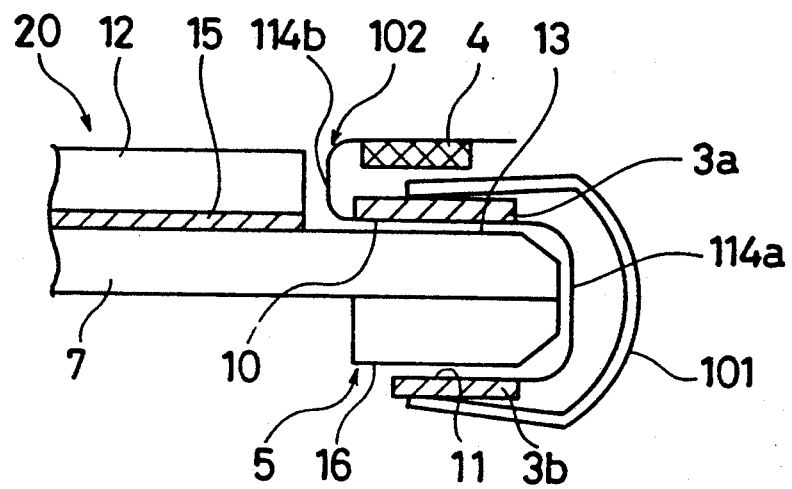
FIG. 1 is a sectional view schematically illustrating a connection structure as a first embodiment of the invention.

Referring to FIG. 1, an electric connection structure as a first embodiment includes a liquid crystal panel 20 such as of a TFT (thin film transistor) type as a first circuit board and a control board 5 as a second circuit board, which are connected with each other by means of a flexible printed wiring 102. The liquid crystal panel 20 comprises a pair of substrates 7,12 and a liquid crystal material injected therebetween, the substrate 7 being provided with a multiplicity of electrode (bus line) terminals 13 at its one end. The control board 5 is provided at its one end with terminals 16 for outputting control signals to drive the liquid crystal panel 20.

Figure 4:
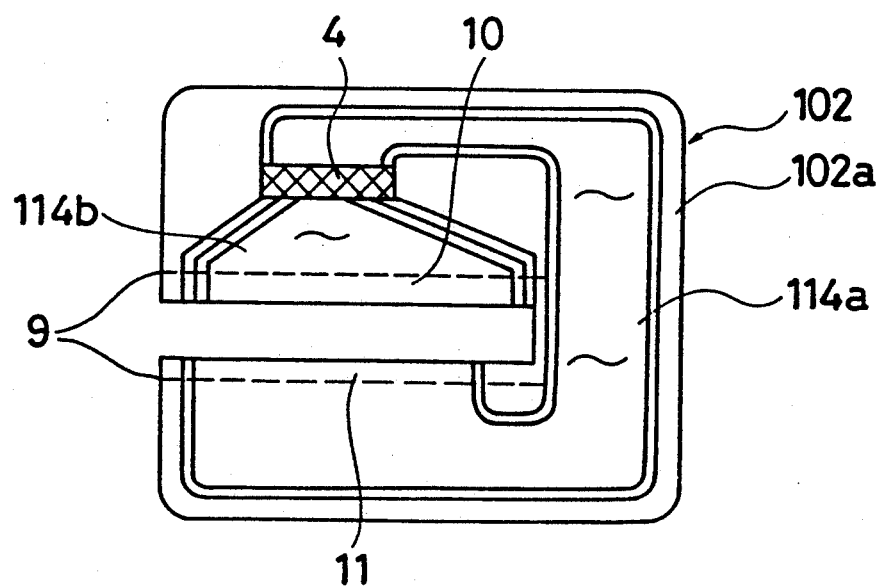
FIG. 4 is a plan view schematically illustrating a flexible wiring used in the first embodiment.
Figure 5:
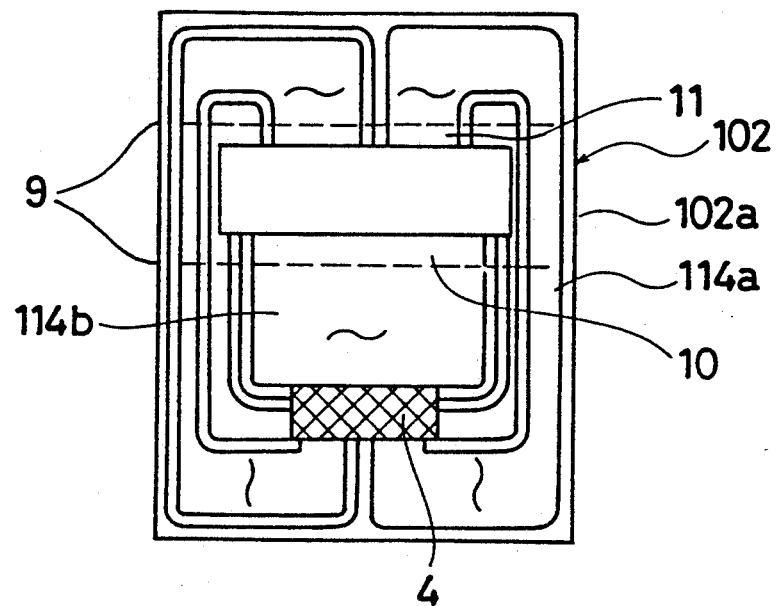
FIG. 5 is a plan view schematically illustrating another flexible wiring as an alternative to the above wiring in FIG. 4.

As shown in FIGS. 4 and 5, the flexible printed wiring 102 comprises on a flexible base 102a such as of polyimide or polyester a driving LSI 4 and wiring lines 114a and 114b extending from an input and output of the LSI 4 and terminating with a signal input terminal 11 and a signal output terminal 10, respectively. The terminals 11 and 10 constitute clip receiving portions 9 to be clamped by a clip 101. Note that the flexible printed wiring 102 shown in FIGS. 4 or 5 is so formed that the driving LSI 4 is located at the liquid crystal panel side and above the signal output terminal 10 when the wiring 102 is mounted on the assembly.

In practically making connections, the substrate 7 of the liquid crystal panel 20 is brought into face-to-face contact with the control board 5 at their terminal-free sides so as to align the terminals 13 and 16 with each other at one end of the assembly. In turn, the flexible printed wiring 102 is brought around the aforesaid end to bring the signal output terminal 10 and the signal input terminal 11 into contact with the terminals 13 and 16, respectively. The assembly is then clamped together by a clip 101 so as to press simultaneously the signal output terminal 10 and the signal input terminal 11 against the terminals 13 and 16, respectively. The clip 101, U-shaped in section, is formed from a shape memory alloy or shape memory resin and designed to exert a pressing force inwardly. Buffer members 3a and 3b such as of a silicone rubber or copper foil may be interposed between the flexible printed wiring 102 and the clip 101.

With the electric connection structure thus arranged, respective connections between the electrode terminal 13 and the signal output terminal 10 and between the terminal 16 and the signal input terminal 11 can be made at a time. In other words, a one-time clamping operation with the clip 101 can complete the connections, hence leading to a facilitated and shortened connecting work. In addition, if only the clip 101 is removed, the connections are released, and the liquid crystal panel 20, the control board 5 and the flexible printed wiring 102 are taken apart. Thus, if there is a defective component, the display device can readily be reworked as compared with that according to the conventional art.

Figure 2:
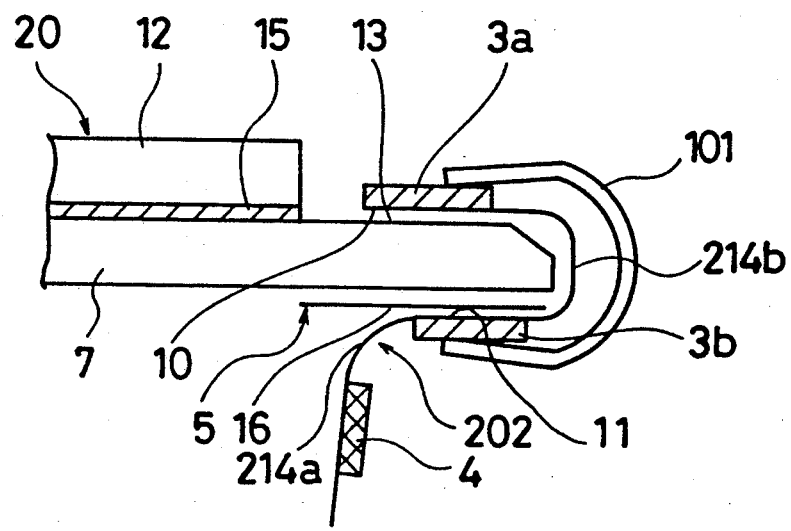
FIG. 2 is a sectional view schematically illustrating another connection structure as a second embodiment of the invention.
Figure 6:
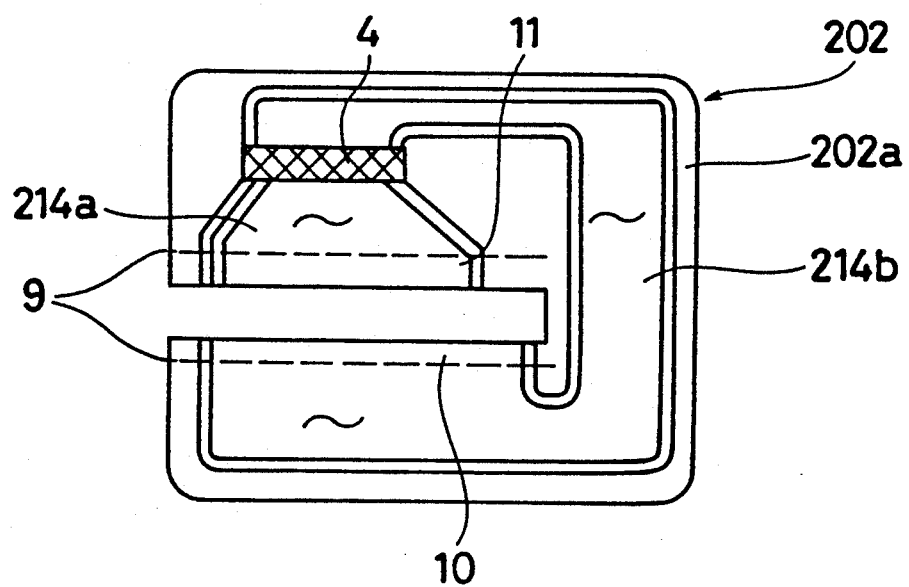
FIG. 6 is a plan view schematically illustrating a flexible wiring used in the second embodiment.
Figure 7:
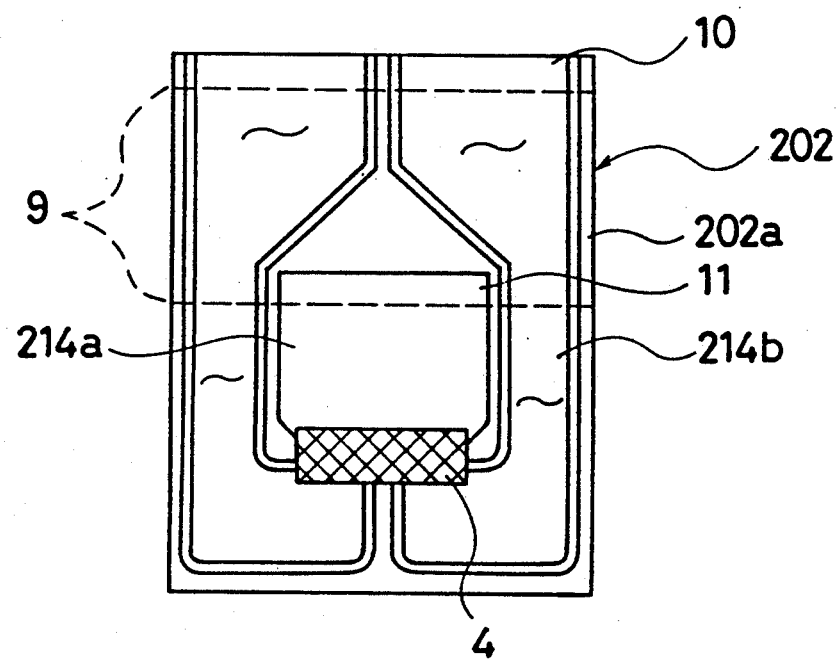
FIG. 7 is a plan view schematically illustrating another flexible wiring as an alternative to the above wiring in FIG. 6.

Referring to FIG. 2, an electric connection structure as a second embodiment uses another type of flexible printed wiring 202 shown in FIG. 6 or 7 instead of the flexible printed wiring 102. Other components are the same as those in the first embodiment. The flexible printed wiring 202 is so constituted that the driving LSI 4 is located in the control board side and below the signal input terminal 11 when the wiring 202 is mounted on the assembly.

Like the first embodiment, this connection structure allows connections to be made with a facilitated and shortened connecting work and to be reworked readily, as compared with that according to the prior art.

Figure 3:
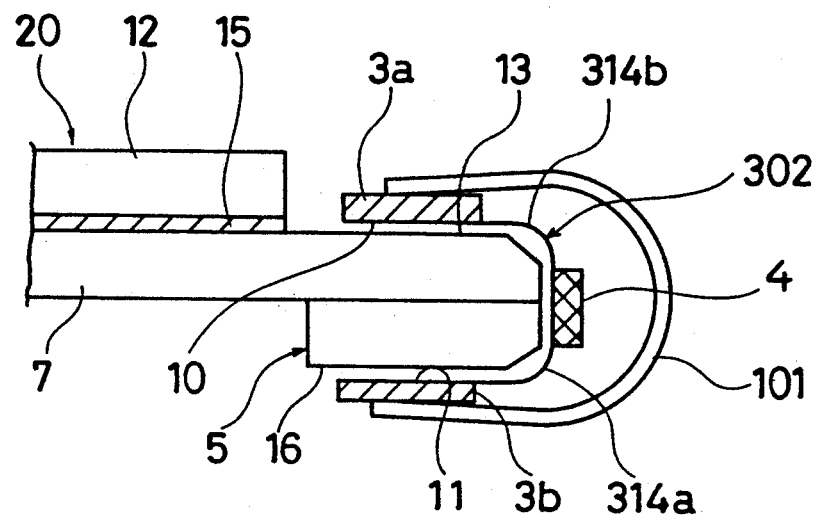
FIG. 3 is a sectional view schematically illustrating still another connection structure as a third embodiment of the invention.
Figure 8:
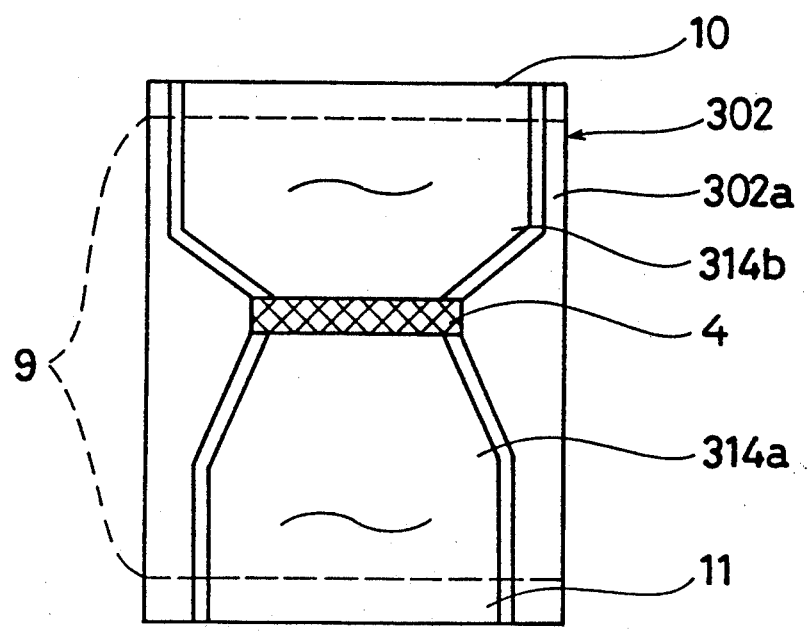
FIG. 8 is a plan view schematically illustrating a flexible wiring used in the third embodiment.
Figure 9:
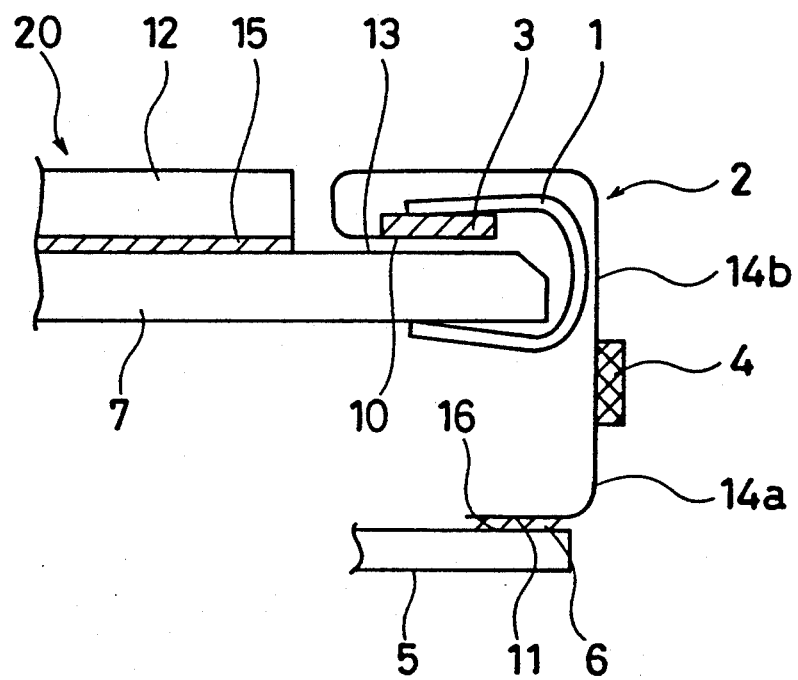
FIG. 9 is a sectional view schematically illustrating a conventional connection structure.

Referring to FIG. 3, an electric connection structure as a third embodiment uses yet another type of flexible printed wiring 302 shown in FIG. 8 instead of the flexible printed wiring 102 or 202. Other components are the same as those in the first or second embodiment. The flexible printed wiring 302 is so constituted that the driving LSI 4 is located between the signal output terminal 10 and the signal input terminal 11 when the wiring 302 is mounted on the assembly. In this case the length of the shorter sides of each LSI chip's terminal portion is about 1.5 mm.

Like the first and second embodiments, this connection structure allows to make connections with a facilitated and shortened connecting work and to be reworked readily, as compared with that according to the prior art.

While in all the above embodiments connection is made between the liquid crystal panel 20 and the control board 5, the present invention is, of course, not limited thereto. It should be understood that the present invention can be widely applied to electric connections between various circuit boards such as printed wiring boards, ceramic wiring boards and the like.

What is claimed is:

1. An electric connection structure comprising:
    a first circuit board having a terminal on one side thereof and terminal free sides;
    a second circuit board having a terminal on one side thereof and terminal free sides with said first and second circuit boards being in face-to-face contact with each other at said terminal free sides;
    a flexible wiring device having a flexible base and a wiring portion on said base said flexible wiring device located to electrically connect the terminal of said first circuit board with the terminal of said second circuit board; and
    holding means, for removably clamping said first and second circuit boards together with said wiring portion of said flexible wiring device sandwiched by said holding means and said first and second circuit boards.

2. An electric connection structure as set forth in claim 1, wherein said holding means is a clip made of a shape memory alloy or a shape memory resin.

3. An electric connection structure as set forth in claim 1, wherein each of the terminals is provided in an end portion of each of said first and second circuit boards.

4. An electric connection structure as set forth in claim 1, wherein said first circuit board is a liquid crystal panel and said second circuit board is a control board for driving said liquid crystal panel.

5. An electrical connection structure as set forth in claim 1, wherein said flexible wiring device is located about the first and second circuit boards at said terminal side.

6. An electrical connection structure as set forth in claim 1, wherein said flexible wiring device includes an LSI located above said first circuit board.

7. An electrical connection device as set forth in claim 1, wherein said flexible wiring device includes an LSI located below said second circuit board.

8. An electrical connection device as set forth in claim 1, wherein said flexible wiring device includes an LSI located adjacent said terminal side.

9. An electrical connection device as set forth in claim 1, wherein there are buffers located between holding means and said flexible wiring device.

10. The electrical connection device as set forth in claim 9, wherein said buffer is formed of silicone rubber.

11. The electrical connection device as set forth in claim 9, wherein said buffer is formed of copper foil.

12. An electric connection structure comprising:
a first circuit board having a terminal on one side and terminal free sides;
a second circuit board having a terminal on one side and terminal free sides, with said first and second circuit boards being in face-to-face contact with each other at said terminal free sides;
a flexible wiring device including a flexible base and a wiring portion on said base;
said flexible wiring device located so that said wiring portion electrically connects said terminal of said first and second circuit boards; and
a clip made of a shape memory alloy or a shape memory resin and of substantially U-shaped in section and large enough to clamp said first and second circuit boards together, removably clamping the first and second boards together with the wiring portion of the flexible wiring device sandwiched by said clip, so as to press the wiring terminal of the first and second circuit boards.

13. An electrical connection structure as set forth in claim 12, wherein said flexible wiring device is located about the first and second circuit boards at said terminal side.

14. An electrical connection structure as set forth i claim 12, wherein said flexible wiring device includes an LSI located above said first circuit board.

15. An electrical connection device as set forth in claim 12, wherein said flexible wiring device includes an LSI located above said first circuit board.

16. The electrical connection device as set forth in claim 12, wherein there are buffers located between ends of the clip and the circuit boards.

17. The electrical connection device as set forth in claim 15, wherein there are buffers located between ends of the clip and the circuit boards.

18. The electrical connection device as set forth in claim 16, wherein the buffers are formed of silicone rubber.

19. The electrical connection device as set forth in claim 12, wherein said flexible wiring device is formed of a plastic base with wiring portions on said base.

20. An electric connection structure as set forth in claim 12, wherein said first circuit board is a liquid crystal panel and said second circuit board is a control board for driving said liquid crystal panel.

* * * * *